United States Patent
Koyata et al.

(10) Patent No.: US 7,226,864 B2
(45) Date of Patent: Jun. 5, 2007

(54) METHOD FOR PRODUCING A SILICON WAFER

(75) Inventors: Sakae Koyata, Tokyo (JP); Kazushige Takaishi, Tokyo (JP); Tohru Taniguchi, Tokyo (JP); Kazuo Fujimaki, Tokyo (JP); Akihiro Kudo, Tokyo (JP); Masashi Norimoto, Tokyo (JP)

(73) Assignee: Sumitomo Mitsubishi Silicon Corporation, Minato-ku, Tokyo (JP)

( * ) Notice: Subject to any disclaimer, the term of this patent is extended or adjusted under 35 U.S.C. 154(b) by 0 days.

(21) Appl. No.: 10/957,030

(22) Filed: Oct. 1, 2004

(65) Prior Publication Data

US 2005/0112893 A1 May 26, 2005

(51) Int. Cl.
*H01L 21/461* (2006.01)
*H01L 21/302* (2006.01)

(52) U.S. Cl. .................. 438/690; 438/691; 438/692

(58) Field of Classification Search .............. None
See application file for complete search history.

(56) References Cited

U.S. PATENT DOCUMENTS

| | | | | |
|---|---|---|---|---|
| 4,885,056 A | * | 12/1989 | Hall et al. ............... | 438/691 |
| 5,800,725 A | * | 9/1998 | Kato et al. ............... | 216/88 |
| 5,904,568 A | * | 5/1999 | Maeda et al. ............ | 438/690 |
| 6,716,722 B1 | * | 4/2004 | Furihata et al. .......... | 438/459 |
| 2002/0081417 A1 | * | 6/2002 | Ushiki et al. ............ | 428/141 |
| 2003/0171075 A1 | * | 9/2003 | Nihonmatsu et al. .... | 451/41 |

* cited by examiner

*Primary Examiner*—Duy-Vu N. Deo
(74) *Attorney, Agent, or Firm*—Reed Smith LLP

(57) ABSTRACT

Provided is an improved method for producing a silicon wafer whose surfaces exhibit precise flatness and minute surface roughness, and which allows one to visually discriminate between the front and rear surfaces, the method comprising a slicing step of slicing a single-crystal ingot into thin disc-like wafers, a chamfering step of chamfering the wafer, a lapping step for flattening the wafer, an etching step for removing processing distortions on the wafer surfaces, a mirror-polishing step for mirror-polishing the surface of the wafer, and a cleaning step for cleaning the wafer. The etching step further comprises a first acid-etching phase and a second alkali-etching phase, and a rear surface mild polishing step is introduced between the first and second etching phases in order to abrade part of roughness formed on the rear surface of the wafer as a result of the first etching phase.

4 Claims, 10 Drawing Sheets

(a) The rear surface of a wafer after mild lapping (b) The rear surface of the same wafer after rear-surface mild polishing (a)

(b)

(c)

(d)

(a)

(b)

(c)

(d)

(b)

(d)

(a)

(c)

METHOD FOR PRODUCING A SILICON WAFER

BACKGROUND OF THE INVENTION

1. Field of the Invention

The present invention provides a method for producing a silicon wafer whereby it is possible to fabricate a wafer both of whose surfaces exhibit a high precision flatness and minute surface roughness, and which allows one to visually discriminate between the front and rear surfaces of the wafer.

2. Description of the Related Art

The conventional method for producing a semiconductor silicon wafer comprises the steps of separating a silicon block from a silicon single-crystal ingot pulled upward, slicing the silicon block to produce wafers, subjecting the wafer to chamfering, mechanical polishing (lapping), etching, and mirror-polishing (polishing), and cleaning the wafer. Thus, a wafer is obtained that has a high precision flatness. The steps constituting the conventional method may be modified in various manners depending on given purposes: some foregoing steps may be exchanged in order for other later steps; a certain step may be repeated two or more times; a heating step or a scraping step may be added or put in the place of an existent step.

A wafer having undergone mechanical processing such as block separation, peripheral abrasion, slicing, lapping, etc., suffers from processing deformations on its surfaces, or has degraded superficial layers which may cause, in later processing, crystallization defects such as slip dislocations or the like, thereby lowering the mechanical strength of the wafer, or exerting adverse effects on the electrical properties of the wafer. Therefore, superficial layers containing such processing distortions must be thoroughly eliminated from the wafer. Usually, to eliminate such superficial layers, the wafer is subjected to etching treatment. The etching treatment can be classified into acid etching based on an acid etching solution comprising mixed acid, and alkali etching based on an alkali etching solution comprising alkali such as NaOH.

As for acid etching, its etching rate on the surface of a wafer markedly varies depending on the species of reactive molecules and concentration gradients of reaction products because the dispersive layer of the etching solution in contact with the wafer surface fluctuates in its thickness as a result of non-uniform flow of the etching solution etc. Therefore, the uniform flatness of the surface obtained as a result of lapping may be damaged during etching, and undulations having an amplitude of the order of a millimeter (mm) or indentations called peel may develop on the surface.

On the other hand, the etching rate in alkali etching is not affected by the species of reactive molecules and concentration gradients of reaction products, and thus the uniform flatness of the surface obtained as a result of lapping is retained even after etching. As long as the obtainment of a wafer having surfaces with a high flatness is concerned, etching based on alkali solution is better than the acid-based counterpart. However, when a wafer is subject to alkali etching, pits (to be called facets hereinafter) having a diameter of several to a few tens micrometers ($\mu$m) and a depth of a few micrometers ($\mu$m) may be formed on the surfaces depending on the orientation of crystal there. In alkali etching, the etching rate greatly differs according to the direction of etching with respect to the orientation of crystal, e.g., etching rates in the crystal directions <100>, <110> and <111> are widely different from each other, namely, the ratios of etching rate among the crystal directions <100>, <110> and <111> are widely different (crystal anisotropy). This crystal anisotropy is responsible for the development of facets in alkali etching. The flaw characteristic with alkali etching includes not only facets but also deep pits having a diameter of several micrometers ($\mu$m) or less, and a depth of a few to several tens micrometers ($\mu$m). If there is a dot-like local flaw or stain on the surface of a wafer, the dot-like flaw will cause reaction to proceed abnormally which may result in the development of a deep pit.

The condition of the rear surface of a wafer after etching is retained until the wafer is processed into a device. Because of this, a problem mentioned below will arise.

When the rear surface of a wafer is attached to a sucking plate for photolithography in order to fabricate a device from the wafer, undulations having an amplitude of the order of a millimeter (mm) of the rear surface formed as a result of acid-based etching are transmitted as they are to the front surface, and the undulations having an amplitude of the order of a millimeter (mm) transmitted to the front surface degrade the resolution of patterned light incident thereupon, which will in the end cause the yield of devices produced to be reduced.

On the other hand, when the rear surface of a wafer having undergone alkali-based etching is attached to a sucking plate for photolithography, the sharp, ragged edges of facets and pits formed on the rough surface of the wafer are tipped off to be scattered into air to produce numerous particles which may cause the lowered yield of device production. A wafer having undergone alkali-based etching causes the development of dust consisting of 4000-5000 particles, and a wafer etched with acid solution is responsible for the development of dust consisting of 2000 particles. In contrast, a wafer both of which surfaces have been mirror-polished evokes scarcely any particle, and does not cause the development of dust.

Thus, if both surfaces of a wafer are mirror-polished, its rear surface will have no coarse roughness that may cause the development of dust, and no undulations with an amplitude of the order of a millimeter (mm) will be evoked. This will ensure the high degree flatness of the surface. In short, such a wafer will be relieved of the problems caused by etching. However, a new problem arises in relation to the mirror-polished wafer. If both surfaces of a wafer are mirror-polished, not only its front surface but its rear surface also have a mirror surface. Because of this, a commonly used wafer detecting sensor which detects the presence of a wafer by receiving light scattered from the surface of the wafer could not detect such a mirror-polished wafer.

To solve the above problem, proposed is a method for producing a semiconductor wafer wherein etching is based on alkali solution, and a rear-surface polishing step is inserted between the etching step and a surface-polishing step, in order to eliminate part of roughness formed on the rear surface of the wafer as a result of alkali-based etching (Japanese Patent No. 2910507). According to this method, it is possible to allow a commonly used wafer detecting sensor to detect the rear surface of a wafer etched by alkali solution, to allow the front surface of the wafer to have a high degree flatness, and to raise the yield of device production.

However, the method disclosed in Japanese Patent No. 2910507 is not completely free from problems. According to this method, etching is performed using an alkali solution whose etching rate varies depending on the etching direction with respect to the orientation of crystal, and thus a wafer etched by the solution will have numerous small facets and even deep pits formed on both of its surfaces. At the succeeding mirror-polishing step, then, it is necessary to remove a sufficiently thick superficial layer from the surfaces of the wafer which may damage the flatness reached as a result of lapping.

Another problem is as follows. Assume that a wafer which has, on its surface particularly of an edge, an abnormal spot consisting of a notch, local flaw or stain as shown in FIG. 10(a) must be etched. If the wafer is etched with an acid solution which etches uniformly being unaffected by the orientation of crystal, a round etched surface is formed around the abnormal spot as shown in FIG. 10(b). On the other hand, if the same wafer is etched with an alkali solution which etches differently with respect to the orientation of crystal, abnormal reaction occurs around the abnormal spot to cause a deep pit to develop there as shown in FIG. 10(c) whose edge might be broken or tipped off to produce particles.

SUMMARY OF THE INVENTION

The object of the present invention is to provide a method for producing a silicon wafer whereby it is possible to fabricate a wafer both of whose surfaces exhibit a high precision flatness and minute surface roughness, and which allows one to visually discriminate between the front and rear surfaces of the wafer.

To achieve the object, the method according to Claim 1 for producing a silicon wafer comprises a slicing step 10 of slicing a single-crystal ingot into thin disc-like wafers, chamfering step 11 of chamfering the wafer obtained from the slicing step 10, lapping step 12 for flattening the chamfered wafer, etching step 13 for eliminating processing distortions introduced as a result of chamfering and lapping, mirror-polishing step 16 for mirror-polishing the surfaces of the wafer, and cleaning step 17 for cleaning the wafer having its surfaces polished.

The method is characterized by that the etching step 13 further comprises a first etching phase 13*a* of etching the wafer with an acid solution and a second etching phase 13*b* of etching the wafer with an alkali solution, the first etching phase being introduced ahead of the second etching phase, and that a rear-surface mild polishing step 14 is inserted between the first etching phase 13*a* and second etching phase 13*b*, in order to polish away part of roughness formed on the rear surface of the wafer as a result of processing during the first etching phase 13*a*.

According to the method described in Claim 1, the etching step 13 comprises a first etching phase 13*a* based on acid solution and second etching phase 13*b* based on alkali solution, and a rear-surface mild polishing step 14 is introduced subsequent to the first etching phase 13*a* in order to eliminate undulations or peel having an amplitude of the order of a millimeter (mm), and then alkali etching is carried out. Through this arrangement of steps, it is possible to increase the size of individual facets formed on the rear surface of a wafer and reduce the number of facets, to inhibit the development of deep pits, to reduce the thickness of a superficial layer to be removed during the mirror-polishing step, and to maintain the high degree flatness of the surface achieved by lapping.

Even if an abnormal spot consisting of a notch, local flaw or stain is present, for example, on an edge surface of a wafer after lapping, the spot would not be a serious cause of dust formation, because since acid-based etching whereby the surface of a wafer is uniformly etched away in all directions unaffected by the orientation of crystal is introduced prior to alkali-etching, the abnormal spot which, if directly subject to alkali-based etching as in the conventional method, would form a deep pit whose rugged edge would be a serious case of dust formation, will form instead a roundly etched surface after the acid-based etching.

BRIEF DESCRIPTION OF THE DRAWINGS

FIG. 2(*b*) is an enlarged sectional view of a part of interest of the rear surface of a wafer showing the condition of the wafer subsequent to mild polishing.

FIG. 10(*b*) is an enlarged sectional view of the same part of the edge surface shown in FIG. 10(*a*) after acid-based etching.

FIG. 10(*c*) is an enlarged sectional view of the same part of the edge surface in FIG. 10(*a*) after alkali-based etching.

DESCRIPTION OF THE PREFERRED EMBODIMENTS

Next, the embodiments of the invention will be described with reference to accompanying drawings.

Figure 1:
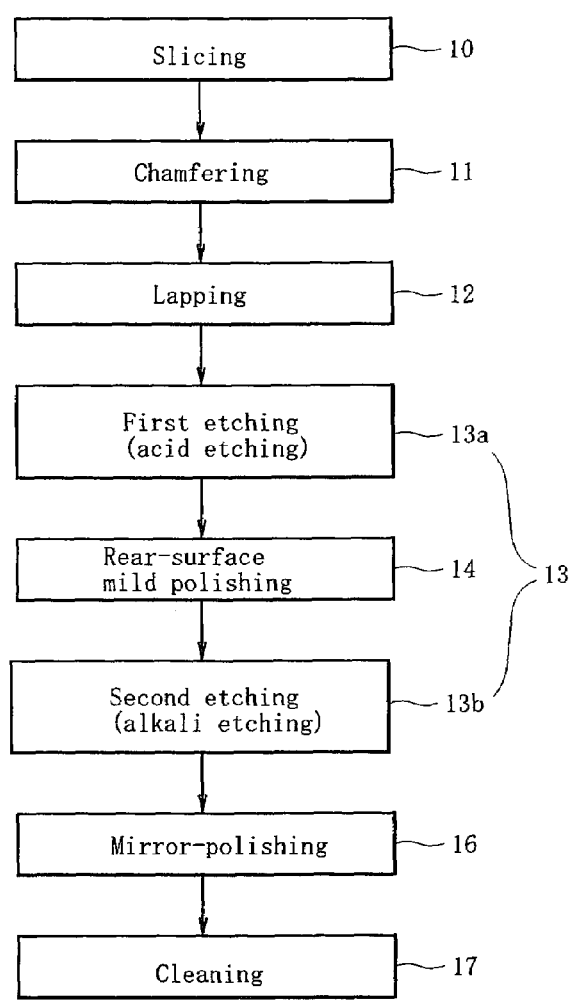
FIG. 1 is a flowchart of the steps constituting the method of the invention.

At first, a single-crystal silicon ingot grown has its front and rear ends removed to produce a silicon cylindrical mass. Then, to make the cylindrical mass uniform in its diameter, the periphery of the silicon mass is scraped to give a silicon block body having a uniform diameter. An orientation flat or orientation notch is formed on the block body to indicate the orientation of crystal in the block. After the processing, as shown in FIG. 1, the block body is sliced with a specified angle with respect to the central axis of the block body (step 10).

Each wafer obtained as a result of slicing is chamfered on its periphery to prevent the development of notches and flaws there (step 11). This chamfering step can prevent the occurrence of crown phenomenon or the abnormal development of an annular ridge which would otherwise occur along the periphery of a wafer when the wafer is subject to epitaxial molecular deposition.

Then, the wafer obtained from the slicing step 10 is mechanically abraded (lapped) so that its surface roughness can be smoothened and the flatness of each surface and the parallelism of both surfaces can be improved (step 12). The wafer having undergone the lapping step 12 is washed and transferred to a next step.

The wafer having superficial layers comprising processing distortions introduced during the chamfering step 11 and lapping step 12 on in its surfaces are subjected to chemical etching to completely eliminate those distortions (step 13).

The feature characteristic with this invention consists in allowing the etching step 13 to comprise a first acid-based etching phase 13a and a second alkali-based etching phase 13b, and allowing a rear-surface mild polishing step 14 to be inserted between the first and second etching phases 13a and 13b so that the rear surface of the wafer which becomes roughened as a result of the first etching 13a is mildly polished to be partly deprived of the surface roughness. Since the etching step 13 is allowed to comprise the first and second etching phases 13a and 13b, flaws characteristic with acid- and alkali-based etchings can be minimized. The total thickness of both superficial layers on the front and rear surfaces of a wafer removed during the first and second etching phases 13a and 13b is 25-30 μm, preferably 25-28 μm.

The introduction of the first etching phase 13a enables the partial elimination of distortions formed on the rear surface of a wafer as a result of mechanical abrasion such as lapping. The first etching phase 13a involves the use of an acid solution comprising hydrofluoric acid and nitric acid, preferably, in addition to them, at least one chosen from acetic acid, sulfuric acid and phosphoric acid. The total thickness of both superficial layers on the front and rear surfaces of a wafer removed during the first etching phase 13a is 20-25 μm, preferably 20-22 μm. If the total thickness of both superficial layers in question were below 20 μm, the elimination of roughness would be insufficiently slight while if the total thickness were over 25 μm, the nanometer-scale topography of crystal clusters would be aggravated.

Figure 2:
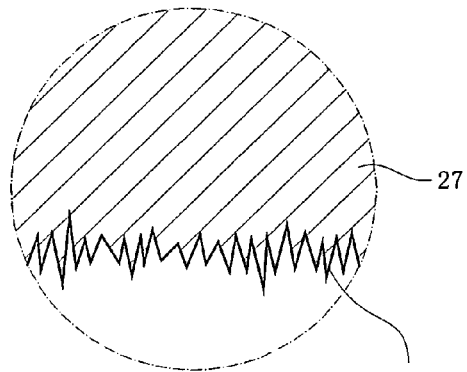
FIG. 2(*a*) is an enlarged sectional view of a part of interest of the rear surface of a wafer showing the condition of the wafer subsequent to a first etching.
Figure 2:
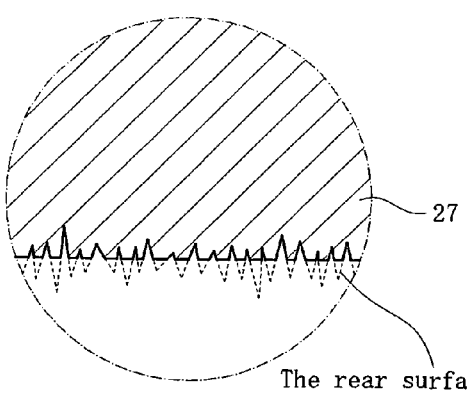

The rear surface of a wafer having undergone the first etching step 13a will partly suffer from processing distortions and undulations or peel of the order of a millimeter (mm) as shown in FIG. 2(a).

Next, a rear-surface mild polishing step is introduced to eliminate the roughness on the rear surface of the wafer formed as a result of the first etching 13a (step 14). As shown in FIG. 2(b), this step partly reduces the roughness formed on the rear surface of the wafer by polishing the surface in question.

The mirror-polishing step 16 as well as the rear surface mild polishing step 14 preceding the step 16 both featuring the invention are based on unilateral polishing. The unilateral polishing will be explained with reference to FIG. 3. The abrading apparatus 20 shown in the figure comprises a stabilized rotatory plate 21 and a wafer holding device 22. The stabilized rotatory plate 21 is a large disc plate, and rotates round an axis 23 jointed to the center of its bottom surface. Onto the top surface of the stabilized rotatory plate 21 abrasion cloth 24 is bonded. The wafer holding device 22 comprises a pressurizing head 22a, and a shaft 22b which is jointed to the pressurizing head 22a to transmit rotation thereto. Onto the lower surface of the pressurizing head 22a an abrasion plate 26 is attached. Onto the lower surface of the abrasion plate 26 plural sheets of silicon wafer 27 are bonded. A tube 29 is placed over the stabilized rotatory plate 21 to supply abrasion fluid 28 thereto. To abrade the silicon wafer 27 with this abrading apparatus 20, the pressurizing head 22a is allowed to descend until it presses the wafer 27 with a specified pressure to stabilize the latter. With abrasion fluid 28 supplied via the tube 29 to the abrasion cloth 24, the pressurizing head 22 and stabilized rotatory plate 21 are rotated in the same direction, so that a surface of the wafer 27 is polished to flatness.

The rear surface of a wafer is abraded for 30-45 sec in the rear-surface mild polishing step 14, or the rear-surface mild polishing is performed such that the rear surface of the wafer has a luster of 120-140% after polishing. If the polishing time is less than 30 sec, or the luster of the rear surface after polishing is less than 120%, roughness having a considerably high amplitude would still remain there, and thus if such a wafer is attached to a sucking plate in a later device fabrication process, the roughness on the rear surface of the wafer would be transmitted to the front surface which would cause a disorder. On the contrary, if the polishing time exceeds 45 sec, or the luster of the rear surface after polishing is over 140%, it would be impossible to tell a front surface from a rear surface of the wafer having undergone the mirror-polishing step 16. After the rear surface mild polishing step 14, roughness of the rear surface of a wafer is restricted within a specified range as shown in FIG. 2(b).

The wafer is then transferred to the second etching phase 13b as shown in FIG. 1, where the superficial layers comprised of processing distortions on the surfaces of the wafer are removed with residual roughness on the rear surface left after the rear-surface mild polishing step 14 being kept as it is. The etching solution used in the second etching phase 13b is based on sodium hydroxide or potassium hydroxide. The total thickness of superficial layers removed from the front and rear surfaces of a wafer during the second etching phase 13b is 5-10 μm. Preferably, the total thickness of superficial layers removed during the second etching phase is 5-8 μm. If the total thickness in question were below 5 μm, the luster decreasing effect of etching will become insignificant. On the contrary, if the total thickness in question exceeded 10 μm, aggravated roughness would be so serious as to be problematic.

The wafer having passed the rear-surface mild polishing step 14 is subjected to mirror-polishing consisting of mechanical, physical and chemical abrasion in combination. Thus, a wafer is obtained whose surfaces have an optically high luster and suffer from no processing distortions (step 16). The wafer whose surfaces are mirror-polished is washed (step 17) and transferred to the device fabrication process. As described above, by passing a coarse silicon wafer through the steps 10 to 17 of the invention, it is possible to obtain a silicon wafer both of whose surfaces exhibit a high precision flatness and minute surface roughness, and which allows one to visually discriminate between its front and rear surfaces.

EXAMPLE

Examples of the invention will be detailed below in comparison with Comparative Examples.

Example 1

A silicon wafer possessed of processing distortions on its surfaces was prepared by slicing a single-crystal silicon ingot into wafers, and chamfering, lapping, and washing the wafer. An acid etching solution was prepared by combining hydrofluoric acid, nitric acid, acetic acid and water to give a volume ratio of (HF:HNO$_3$:CH$_3$COOH:H$_2$O)=1:5:5:1. The acid etching solution thus prepared was transferred into an etching tank and its temperature was kept at 90° C. An alkali etching solution containing potassium hydroxide at 48 wt % was prepared, and transferred into another etching tank, and its temperature was kept at 90° C.

Then, wafers prepared as above were immersed in the acid etching solution in the acid etching tank with stirring, and kept there for 3 minutes with an intention to allow superficial layers having a total thickness of 20 μm to be removed from the front and rear surfaces of each wafer. After acid etching, the wafers were rinsed with ultra-pure water.

Figure 3:
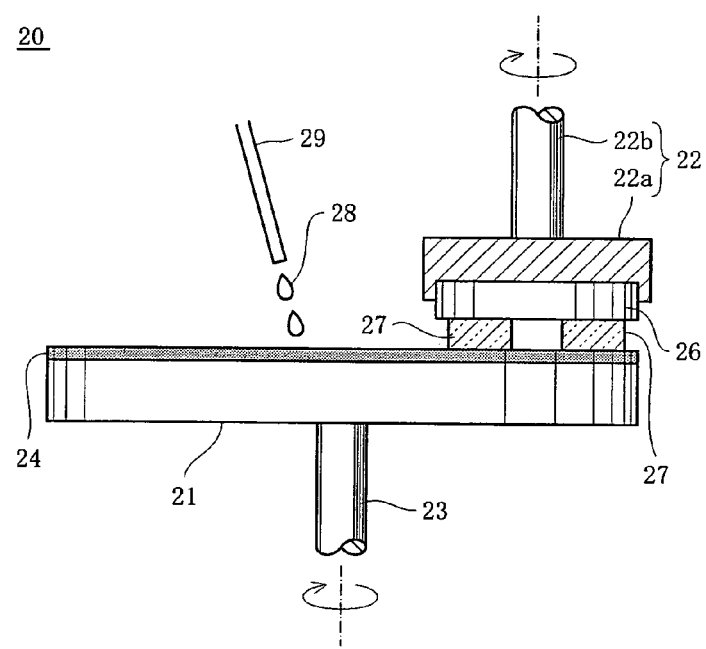
FIG. 3 is a schematic diagram of a unilateral abrading apparatus used for rear surface mild polishing and mirror-surface polishing.

After being dried, the rear surface of the wafer was abraded with a unilateral abrading apparatus shown in FIG. 3 at an abrasion pressure of 7.84×10$^3$ Pa and slurry flow of 2.8 1/minute until the surface in question came to have a luster of 120-140%.

Next, wafers processed as above were immersed in the alkali etching solution in the alkali etching tank with stirring, and kept there for 3 minutes with an intention to allow superficial layers having a total thickness of 10 μm to be removed from the front and rear surfaces of each wafer. After alkali etching, the wafers were rinsed with ultra-pure water and dried. Each of the dried wafers has its surface mirror-polished and was washed to afford a finished wafer.

Comparative Example 1

A silicon wafer possessed of processing distortions on its surfaces was prepared by slicing a single-crystal silicon ingot into wafers, and chamfering, lapping, and washing the wafer. An alkali etching solution containing 48 wt % potassium hydroxide was prepared and transferred into an alkali etching tank, and its temperature was kept at 65° C.

Then, wafers prepared as above were immersed in the etching solution in the alkali etching tank with stirring, and kept there for 30 minutes with an intention to allow superficial layers having a total thickness of 30 μm to be removed from the front and rear surfaces of each wafer. After alkali etching, the wafers were rinsed with ultra-pure water and dried. Each of the dried wafers has its surface mirror-polished and was washed to afford a finished wafer.

Comparative Example 2

A silicon wafer possessed of processing distortions on its surfaces was prepared by slicing a single-crystal silicon ingot into wafers, and chamfering, lapping, and washing the wafer. An alkali etching solution containing 48 wt % potassium hydroxide was prepared and transferred into an alkali etching tank, and its temperature was kept at 90° C.

Then, wafers prepared as above were immersed in the etching solution in the alkali etching tank with stirring, and kept there for 8 minutes with an intention to allow superficial layers having a total thickness of 30 μm to be removed from the front and rear surfaces of each wafer. After alkali etching, the wafers were rinsed with ultra-pure water and dried. Each of the dried wafers has its surface mirror-polished and was washed to afford a finished wafer.

Comparative Example 3

A silicon wafer possessed of processing distortions on its surfaces was prepared by slicing a single-crystal silicon ingot into wafers, chamfering and lapping, and polishing the edge of each wafer using an alkaline chemical solution. An alkali etching solution containing 48 wt % potassium hydroxide was prepared and transferred into an alkali etching tank, and its temperature was kept at 65° C.

Then, wafers prepared as above were immersed in the etching solution in the alkali etching tank with stirring, and kept there for 30 minutes with an intention to allow superficial layers having a total thickness of 30 μm to be removed from the front and rear surfaces of each wafer. After alkali etching, the wafers were rinsed with ultra-pure water and dried. Each of the dried wafers has its surface mirror-polished and was washed to afford a finished wafer.

Evaluation 1

For each of the wafers obtained from Example 1, and Comparative Examples 1 and 2, a circular area having a diameter of 196 mm was defined on its surface, and particles present within the circular area were counted with a laser particle counter whose lowest detection limit is 0.10 μm. The number of defective light scattering spots (Light Point Defects or LPDs) and their size distribution for the wafers from Example 1 and Comparative Examples 1 and 2 are shown in FIG. 4.

Figure 4:
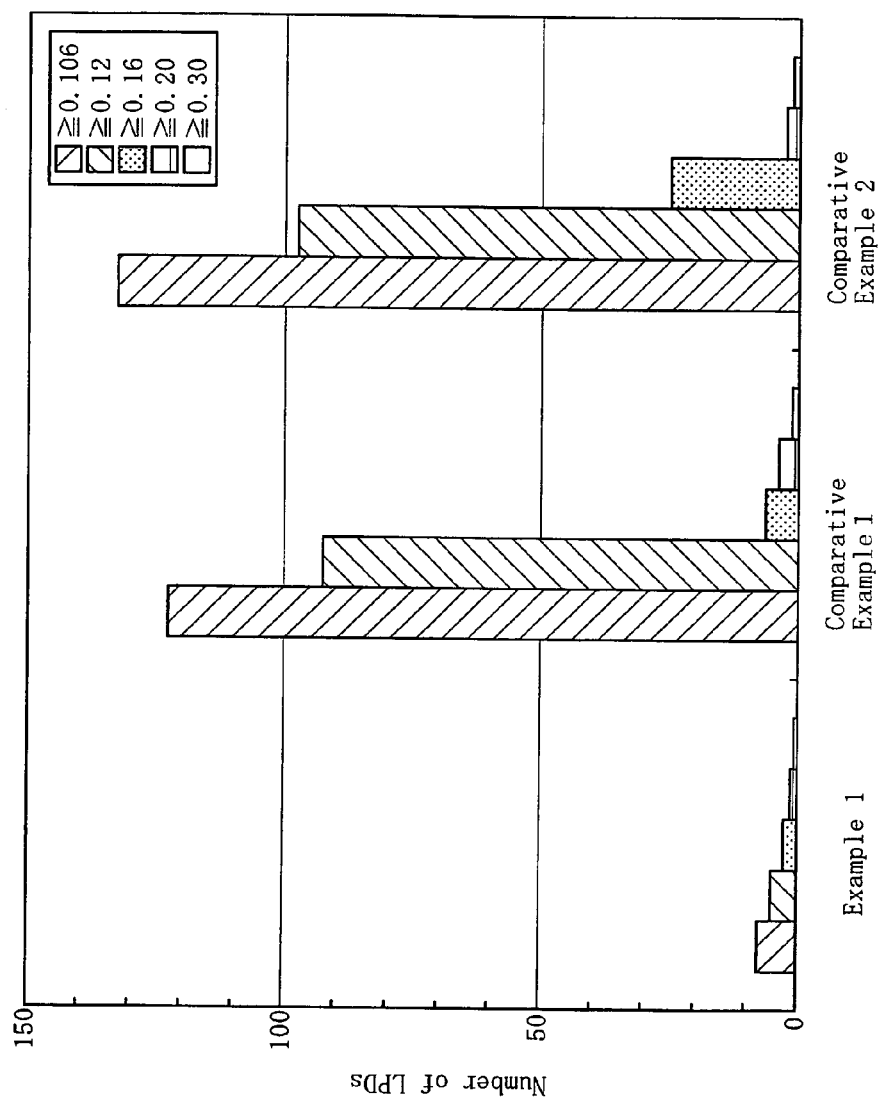
FIG. 4 shows the occurrence of light point defects (LPDs) classified by the size of LPDs obtained from wafers of Example 1 and those of Comparative Examples 1 and 2.

As is obvious from FIG. 4, for the wafers from Comparative Examples 1 and 2, when the lowest detection limit was set to 0.106, 0.12 or 0.16 μm, many particles were counted. In contrast, for the wafers from Example 1, even with the lowest detection limit being set to the same level, the number of particles detected was very small, suggesting that the inventive method can inhibit the development of particles during the processing of wafers.

Evaluation 2

For a wafer prepared by the method of Example 1, the condition of its rear surface was evaluated with a luster meter and atomic force microscope at the termination of each step, and the changes of luster and roughness (in terms of root-mean-square roughness or $R_{ms}$) of the rear surface in the course of processing were followed. The measurement was performed when the wafer had completed acid etching and rear surface mild polishing, and while it was undergoing alkali etching: at a stage when superficial layers having a total thickness of 3 μm were removed, at a second stage when the superficial layers having a total thickness of 5 μm were removed, and at a third and last stage where the superficial layers having a total thickness of 7 μm were removed. From the measurement results, the relationship between the luster and root mean square roughness $R_{ms}$ of the rear surface of the wafer was determined as shown in FIG. 5.

Figure 5:
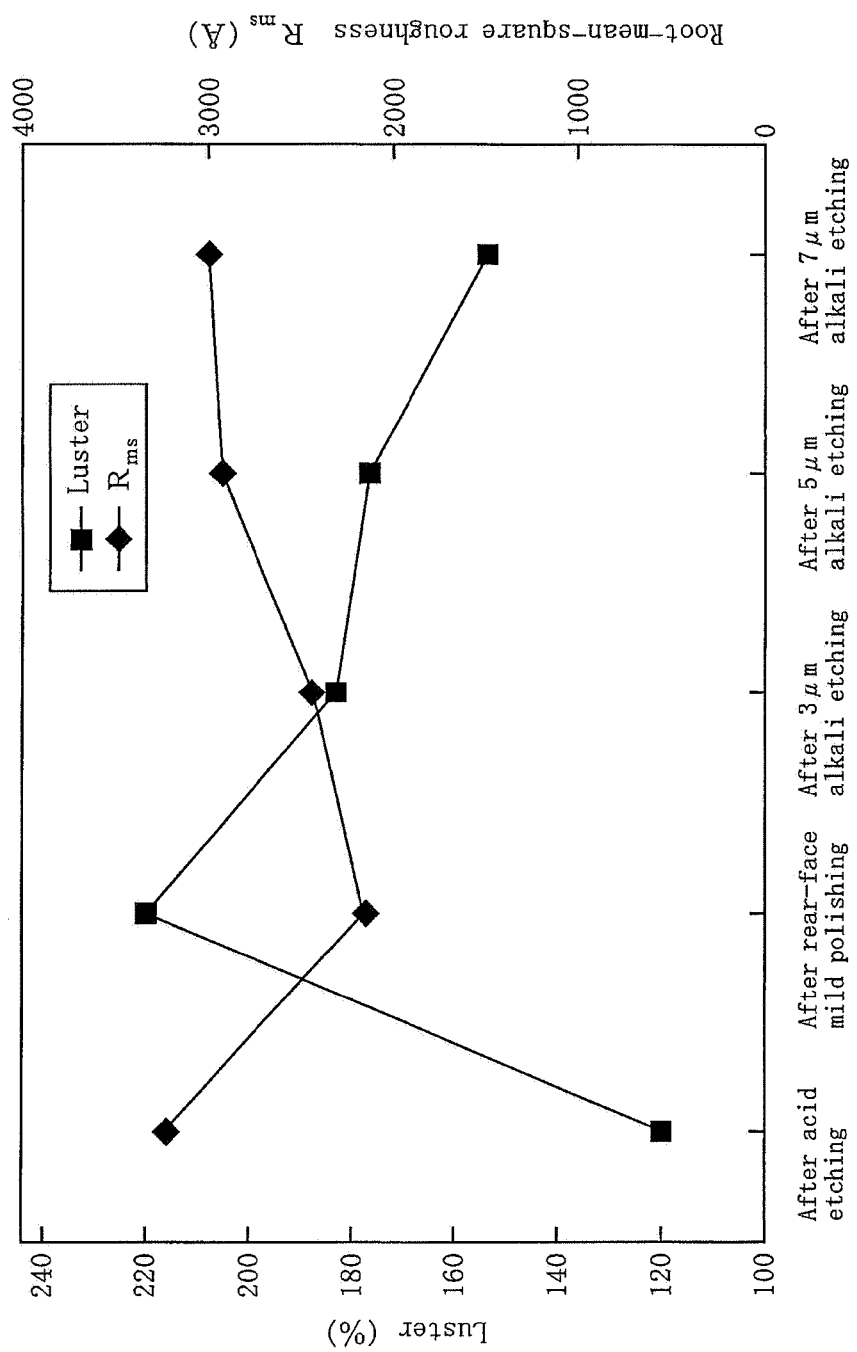
FIG. 5 shows the relationship between the luster and root mean square roughness $R_{ms}$ of the surface of a wafer plotted at the end of each step during the course of wafer production in Example 1.
Figure 6:
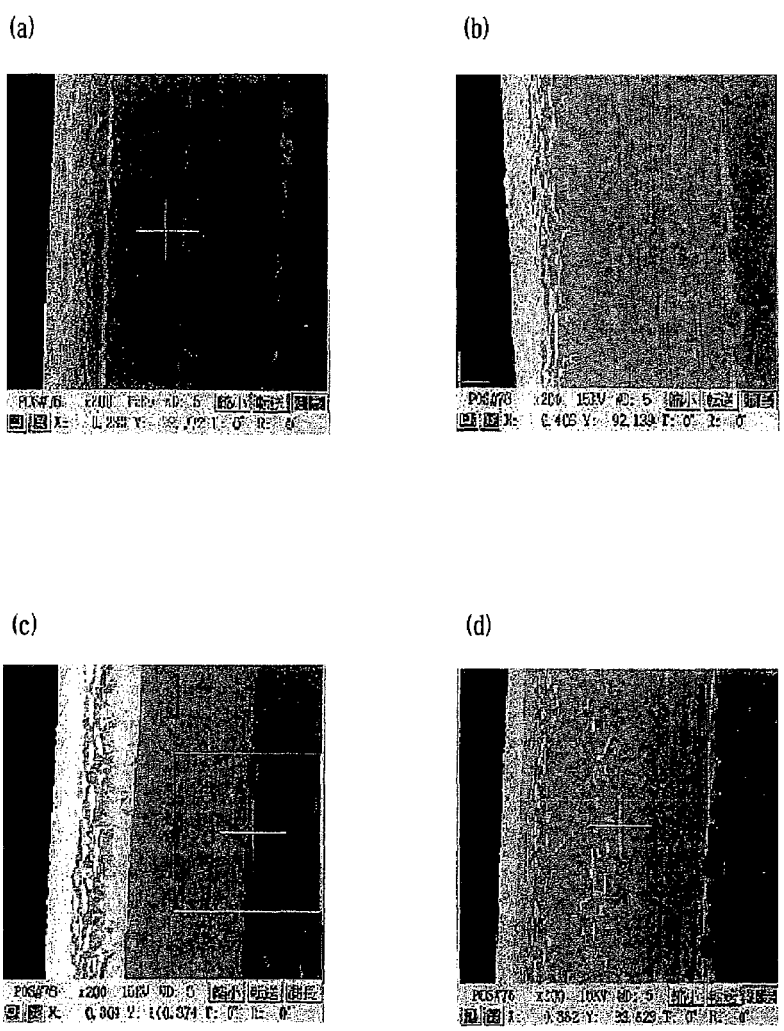
FIG. 6 shows 200×SEM (scanning electronmicroscopy) photographic plates of the edge surface of wafers prepared in Example 1 (FIG. 6(*a*)) and Comparative Example 1 (FIG. 6(*b*)), Comparative Example 2 (FIG. 6(*c*)), and Comparative Example 3 (FIG. 6(*d*)).
Figure 7:
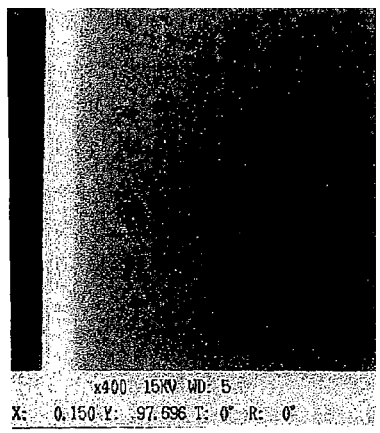
FIG. 7*a*-7*d* shows 400×SEM photographic plates of the wafers arranged in the same manner as in FIG. 6.
Figure 7:
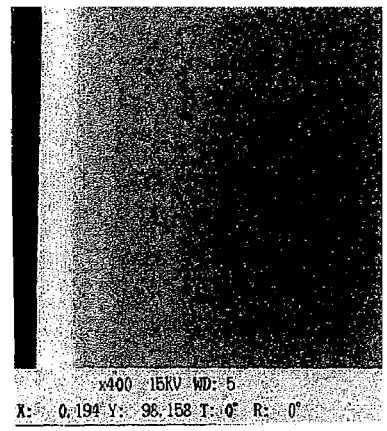
Figure 7:
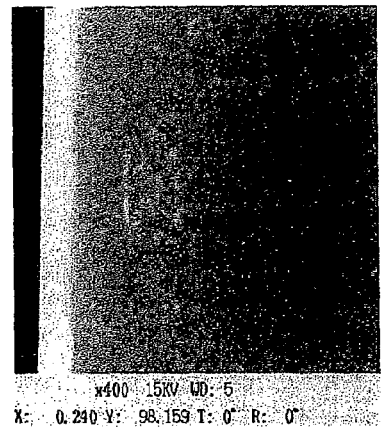
Figure 7:
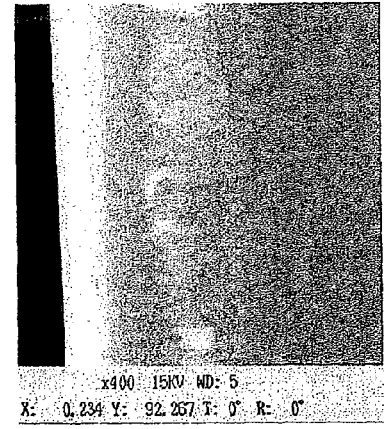
Figure 8:
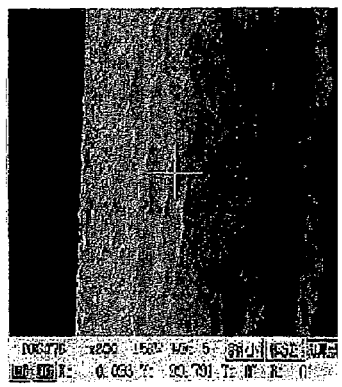
FIG. 8*a*-8*d* shows 800×SEM photographic plates of the wafers arranged in the same manner as in FIG. 6.
Figure 8:
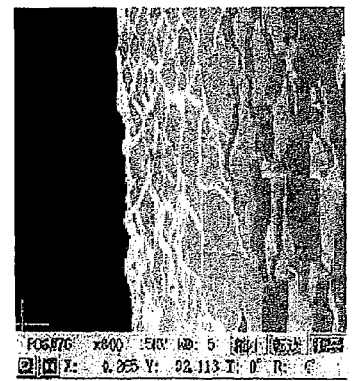
Figure 8:
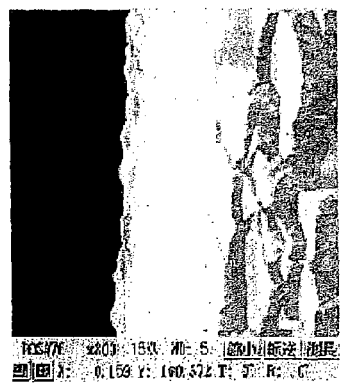
Figure 8:
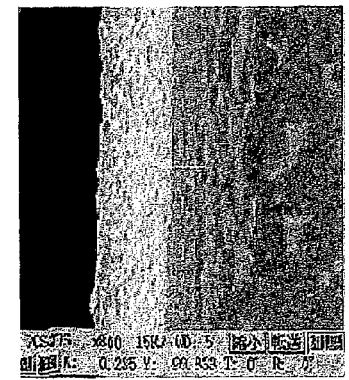
Figure 9:
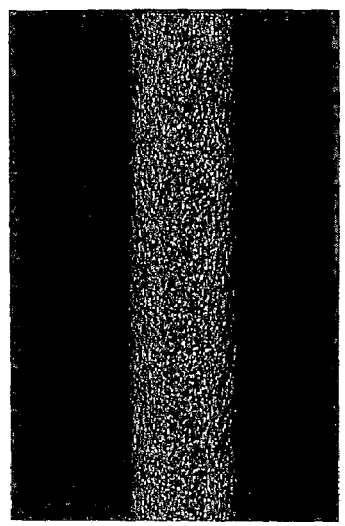
FIG. 9*a*-9*d* shows 175×CCD images the wafers arranged in the same manner as in FIG. 6.
Figure 9:
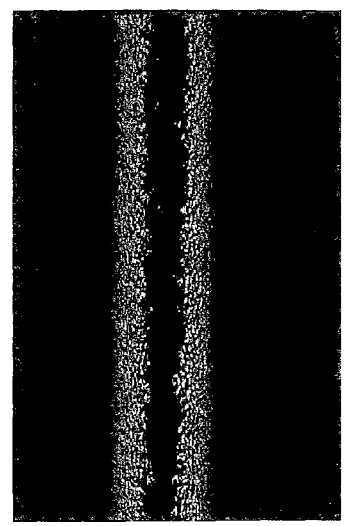
Figure 9:
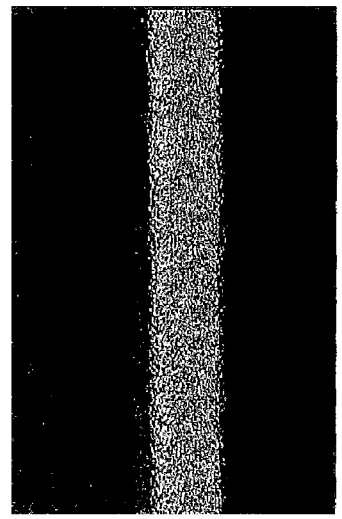
Figure 9:
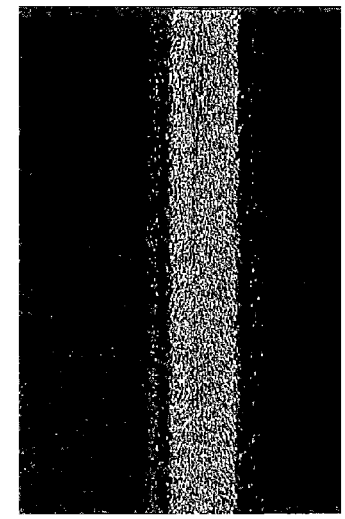
Figure 10:
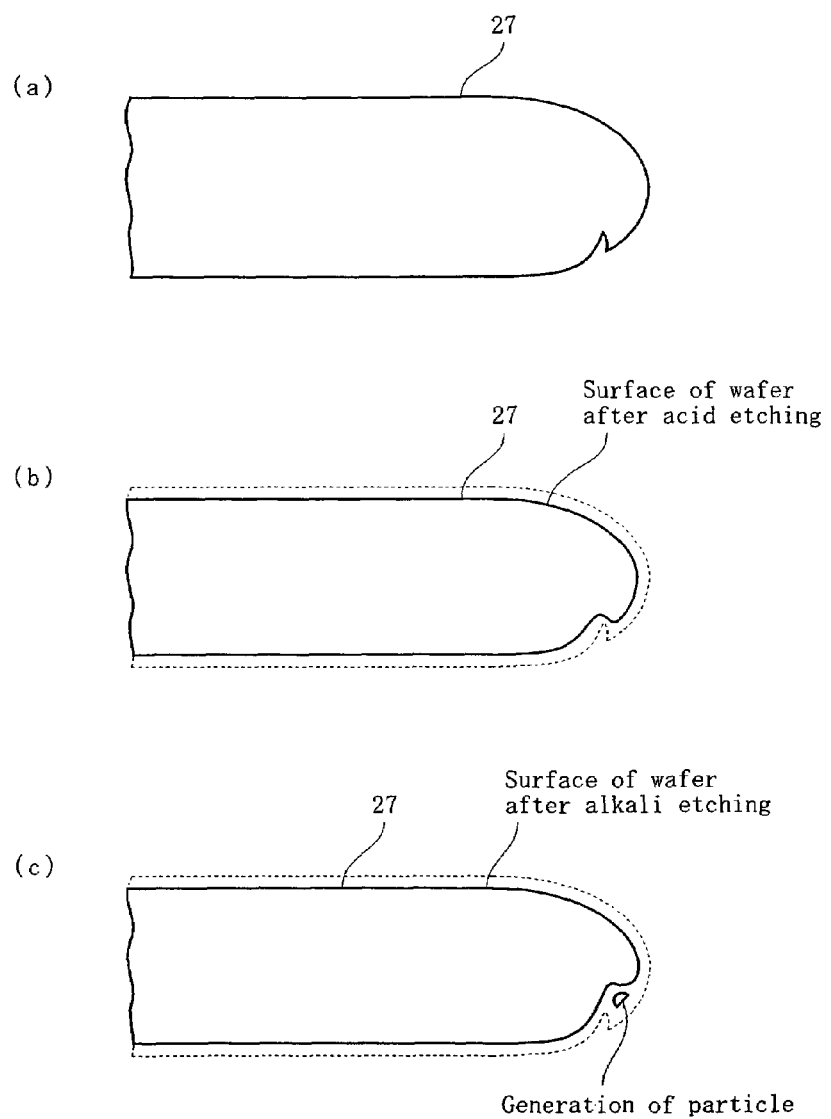
FIG. 10(*a*) is an enlarged sectional view of a part of interest of the edge surface of a wafer on which a flaw is present.

As is obvious from FIG. 5, when the rear surface of the wafer after acid etching is compared with the same after rear surface mild polishing, the luster increases while the surface roughness $R_{ms}$ decreases. As for the alkali etching subsequent to the above, with increase of the thickness of removed superficial layers as a result of prolonged etching, the luster decreases while the roughness $R_{ms}$ increases.

Evaluation 3

The edge surface of wafers obtained from Example 1, and Comparative Examples 1 to 3 was examined at 200×, 400× or 800× magnification with a scanning electron microscope (SEM). The 200× photographic plates of the edge surface of wafers prepared in Example 1, and Comparative Examples 1, 2 and 3 are shown in FIGS. 6(a), 6(b), 6(c) and 6(d), respectively. The 400× photographic plates of the edge surface of the same wafers are shown in FIGS. 7(a) to 7(d), and the 800× photographic plates of the same wafers are shown in FIGS. 8(a) to 8(d). Furthermore, the edge surface of wafers from Example 1, and Comparative Examples 1 to 3 was examined at 175× magnification with a CCD image sensor. The measurement results are shown in FIGS. 9(a) to 9(d).

As is obvious from FIGS. 6 to 9, inspection of the photographic plates shown in FIGS. 6(b) to 6(d), 7(b) to 7(d), 8(b) to 8(d), and 9(b) to 9(d) all representing the edge surface of wafers obtained from Comparative Examples 1, 2 and 3 reveals cracks and fractures, and cavities possibly resulting from the separation of flakes from the wafer edge. In contrast, the edge surface of wafers obtained from Example 1 which is shown in FIGS. 6(a), 7(a), 8(a) and 9(a) is smooth and free from flaws such as cracks and fractures.

As described above, a wafer, after being processed by the inventive method comprising steps 10 to 17, becomes controlled in the smoothness of its surfaces such that its front surface has a higher luster than does the rear surface; both surfaces have a high precision flatness and minute roughness; it will not cause any problem such as poor detectability or detection error when it receives light from a detector monitoring the presence of a wafer while it is carried on a conveyor unit in the later device fabrication process; and its front and rear surfaces appear so different from each other as to allow one to visually discriminate between the two.

What is claimed is:

1. A method for producing a silicon wafer comprising:
   a slicing step of slicing a single-crystal ingot into thin disc-like wafers;
   a chamfering step of chamfering the wafer obtained from the slicing step;
   a lapping step for flattening the chamfered wafer;
   an etching step for eliminating processing distortions on the surfaces of the wafer introduced during the chamfering and lapping steps;
   a mirror-polishing step for mirror-polishing the surface of the etched wafer; and
   a cleaning step for cleaning the mirror-polished wafer, wherein:
   the etching step consists of a first etching phase for acid-etching the wafer followed by a rear-surface mild polishing step for abrading part of roughness formed on the rear surface of the wafer as a result of the first etching phase followed by a second etching phase for alkali-etching the wafer after the first etching phase; and wherein:
   the total thickness of superficial layers on the front and rear surfaces of a wafer removed during the first and second etching phases constituting the etching step is 25-30 μm with the summed thickness of superficial layers on the front and rear surfaces of the wafer removed by acid etching during the first etching phase being 20-25 μm, and the summed thickness of superficial layers on the front and rear surfaces of the wafer removed by alkali etching during the second etching phase being 5-10 μm, wherein the time for abrading the rear surface of a wafer during the rear surface mild polishing step is 30-45 sec, or the rear surface mild polishing is performed such that the rear surface of the wafer has a luster of 120-140% after polishing.

2. The method according to claim 1 wherein the acid etching solution used in the first etching phase contains hydrofluoric acid and nitric acid.

3. The method according to claim 2 wherein the acid etching solution used in the first etching phase further comprises at least one chosen from acetic acid, sulfuric acid and phosphoric acid.

4. The method according to claim 1 wherein the alkali etching solution used in the second etching phase is based on sodium hydroxide or potassium hydroxide.

* * * * *